(12) United States Patent
Yoshida et al.

(10) Patent No.: US 10,272,642 B2
(45) Date of Patent: Apr. 30, 2019

(54) HOT PRESS CUSHIONING MATERIAL AND MANUFACTURING METHOD THEREOF

(71) Applicant: YAMAUCHI CORPORATION, Osaka (JP)

(72) Inventors: Akira Yoshida, Osaka (JP); Takamitsu Ozeki, Osaka (JP)

(73) Assignee: Yamauchi Corporation, Osaka (JP)

( * ) Notice: Subject to any disclaimer, the term of this patent is extended or adjusted under 35 U.S.C. 154(b) by 0 days.

(21) Appl. No.: 15/317,037

(22) PCT Filed: Jun. 29, 2015

(86) PCT No.: PCT/JP2015/068652
§ 371 (c)(1),
(2) Date: Dec. 7, 2016

(87) PCT Pub. No.: WO2016/002705
PCT Pub. Date: Jan. 7, 2016

(65) Prior Publication Data
US 2017/0129206 A1 May 11, 2017

(30) Foreign Application Priority Data
Jun. 30, 2014 (JP) .................... 2014-134795

(51) Int. Cl.
*B32B 5/26* (2006.01)
*B32B 3/26* (2006.01)
(Continued)

(52) U.S. Cl.
CPC ............... *B32B 5/26* (2013.01); *B29C 43/18* (2013.01); *B29C 43/3642* (2013.01);
(Continued)

(58) Field of Classification Search
None
See application file for complete search history.

(56) References Cited

U.S. PATENT DOCUMENTS

| | | | |
|---|---|---|---|
| 6,514,888 B1 * | 2/2003 | Tanaka .................. | B30B 15/061 428/909 |
| 2005/0014437 A1 * | 1/2005 | Yoshida ................ | B29C 43/003 442/415 |
| 2014/0120792 A1 | 5/2014 | Yoshida et al. | |

FOREIGN PATENT DOCUMENTS

| | | |
|---|---|---|
| EP | 0 703 069 A1 | 3/1996 |
| EP | 1 084 821 A2 | 3/2001 |

(Continued)

OTHER PUBLICATIONS

Machine translation of WO2008065969, Yoshida, Jun. 2008.*
Office Action for corresponding European Patent Application No. 15814064.0-1706, dated Nov. 7, 2017, 9 pages.

*Primary Examiner* — Shawn Mckinnon
(74) *Attorney, Agent, or Firm* — Ditthavong & Steiner, P.C.

(57) ABSTRACT

A hot press cushioning material (10) of the present invention includes, as a base material, a woven fabric layer (11) using bulky yarn (12) as at least one of the warp and weft, and a nonwoven fabric layer (14) placed on one surface side of the woven fabric layer (11), a part of the nonwoven fabric layer (14) being embedded in the woven fabric layer (11). A nonwoven fabric-resin composite layer (18) is formed in the opposite surface of the nonwoven fabric layer (14) from the woven fabric layer (11) by impregnation with resin (15). A woven fabric-rubber composite layer (19) is formed in the other surface of the woven fabric layer (11) by impregnation with rubber (16). The nonwoven fabric-resin composite layer (18) and the woven fabric-rubber composite layer (19) have voids (17) therein.

7 Claims, 7 Drawing Sheets

(51) Int. Cl.
*B32B 5/02* (2006.01)
*B32B 7/12* (2006.01)
*B29C 70/04* (2006.01)
*B29D 7/00* (2006.01)
*B32B 5/24* (2006.01)
*B32B 25/10* (2006.01)
*B29C 43/18* (2006.01)
*B32B 27/12* (2006.01)
*B30B 15/02* (2006.01)
*B30B 15/34* (2006.01)
*H05K 3/00* (2006.01)
*B32B 5/08* (2006.01)
*B29C 43/36* (2006.01)
*B30B 15/06* (2006.01)
*B29L 7/00* (2006.01)
*B29K 101/00* (2006.01)
*B29K 105/08* (2006.01)
*B29K 21/00* (2006.01)
*B29K 105/06* (2006.01)

(52) U.S. Cl.
CPC .............. *B29C 70/04* (2013.01); *B29D 7/00* (2013.01); *B30B 15/02* (2013.01); *B30B 15/061* (2013.01); *B30B 15/34* (2013.01); *B32B 3/26* (2013.01); *B32B 5/022* (2013.01); *B32B 5/024* (2013.01); *B32B 5/08* (2013.01); *B32B 5/24* (2013.01); *B32B 7/12* (2013.01); *B32B 25/10* (2013.01); *B32B 27/12* (2013.01); *H05K 3/00* (2013.01); *B29C 2043/3655* (2013.01); *B29K 2021/00* (2013.01); *B29K 2101/00* (2013.01); *B29K 2105/06* (2013.01); *B29K 2105/0809* (2013.01); *B29K 2105/0854* (2013.01); *B29L 2007/00* (2013.01); *B32B 2250/02* (2013.01); *B32B 2250/03* (2013.01); *B32B 2250/04* (2013.01); *B32B 2250/05* (2013.01); *B32B 2250/20* (2013.01); *B32B 2250/40* (2013.01); *B32B 2260/023* (2013.01); *B32B 2260/046* (2013.01); *B32B 2260/048* (2013.01); *B32B 2262/02* (2013.01); *B32B 2262/0269* (2013.01); *B32B 2262/101* (2013.01); *B32B 2307/56* (2013.01); *B32B 2307/734* (2013.01); *B32B 2457/08* (2013.01); *B32B 2457/202* (2013.01)

(56) References Cited

FOREIGN PATENT DOCUMENTS

| | | |
|---|---|---|
| JP | H07156335 A | 6/1995 |
| JP | H0890577 A | 4/1996 |
| JP | 2007090796 A | 4/2007 |
| JP | 4183558 B2 | 11/2008 |
| JP | 4746523 B2 | 8/2011 |
| JP | 5341733 B2 | 11/2013 |
| KR | 20010070076 A | 7/2001 |
| WO | 2008065969 A1 | 6/2008 |
| WO | WO2008065969 * | 6/2008 |
| WO | 2009072463 A1 | 6/2009 |

* cited by examiner

HOT PRESS CUSHIONING MATERIAL AND MANUFACTURING METHOD THEREOF

CROSS-REFERENCE TO RELATED APPLICATIONS

The present application is a national phase application of PCT Application No. PCT/JP2015/068652, filed Jun. 29, 2015, which claims priority to Japanese Patent Application No. 2014-134795, filed on Jun. 30, 2014, the entire contents of which are herein incorporated by reference.

TECHNICAL FIELD

The present invention relates to cushioning materials for hot press and manufacturing methods thereof. More particularly, the present invention relates to cushioning materials for hot press which are used when an intended product is press formed or thermocompression bonded in a process of manufacturing a precision equipment component (hereinafter referred to as "laminate" in the present invention) such as a printed circuit board like a copper-clad laminate, a flexible printed circuit board, or a multilayer board, an IC card, a liquid crystal display panel, or a ceramic laminate, and manufacturing methods thereof.

BACKGROUND ART

When manufacturing a laminate such as a printed circuit board, the following method is used in a press-forming or thermocompression bonding process. As shown in FIG. 16, a laminate material 112, which is an object to be pressed, is placed between heating platens 113 serving as heating and pressing means and a certain pressure and temperature are applied to the laminate material 112. In order to produce a formed product with high precision, it is necessary to uniformly heat and press the entire surface of the laminate material 112 in hot press. For this purpose, the hot press is performed with a flat plate-like cushioning material 111 interposed between each heating platen 113 and the laminate material 112.

Conventionally, a paper cushioning material such as kraft paper, a felt cushioning material, etc. is used as such a hot press cushioning material 111. Paper cushioning materials are inexpensive and have cushioning properties. However, the paper cushioning materials cannot be restored after pressing and therefore cannot be repeatedly used for a plurality of presses. Moreover, if the paper cushioning materials are used at high temperatures (e.g., 200° C. or higher), they get burnt and stuck on the heating platens 113, producing paper dust.

Felt cushioning materials are flexible and therefore have cushioning properties. However, the felt cushioning materials, due to their poor temporal stability, cannot uniformly transmit the heat and the pressure from the heating platens 113 to the laminate material 112 across the entire pressing surface after repeated use. Repeated use of the felt cushioning materials therefore produces defective pressed products and also causes fibers to coming off from the surfaces of the felt cushioning materials.

Japanese Patent Nos. 4746523 (Patent Literature 1), 5341733 (Patent Literature 2), 4183558 (Patent Literature 3), etc. propose a hot press cushioning material that can be repeatedly used for high temperature press.

Patent Literature 1 discloses a hot press cushioning material that includes a fiber-rubber composite material layer made of a woven fabric and rubber with which the woven fabric has been impregnated. Bulky yarn made of glass fiber is used as at least one of warp and weft of the woven fabric, and the fiber-rubber composite material layer has voids therein. Patent Literature 2 discloses a hot press cushioning material that includes a surface layer material placed in its surface layer. The surface layer material is formed by a woven fabric layer comprised of bulky yarn, a resin layer covering one surface of the woven fabric layer, and a rubber layer covering the other surface of the woven fabric layer. The woven fabric layer has a woven fabric-resin composite layer and a woven fabric-rubber composite layer and has voids therein. Patent Literature 3 discloses a hot press cushioning material that includes a base material and a releasable coating film formed on the base material and made of a resin composition. The releasable coating film contains a base material comprised of a predetermined resin, and organic powder and inorganic powder which are mixed with the base material.

CITATION LIST

Patent Literatures

Patent Literature 1: Japanese Patent No. 4746523
Patent Literature 2: Japanese Patent No. 5341733
Patent Literature 3: Japanese Patent No. 4183558

SUMMARY OF INVENTION

Technical Problem

Recent printed circuit boards are very thin (e.g., 50 μm or less) and are produced by using a resin having high heat resistance. If a pressure is even slightly unevenly applied in hot press when producing such a printed circuit board, the resultant product has defects such as air bubbles, an unsatisfactory thickness, or an unintended thin portion. The hot press cushioning materials described in Patent Literatures 1 to 3 are not flexible at their surfaces and therefore spot deformation is less likely to occur in these hot press cushioning materials. Accordingly, these hot press cushioning materials do not sufficiently conform to fine unevenness. Accordingly, if the hot press cushioning materials described in Patent Literatures 1 to 3 are used in hot press to produce a laminate such as a recent printed circuit board, these cushioning materials may not be able to absorb unevenness of the heating platens 113 etc. such as small warps or flaws.

In view of the above problem, it is an object of the present invention to provide a hot press cushioning material that has improved conformability to fine unevenness and that can be used repeatedly.

Solution to Problem

A hot press cushioning material according to the present invention includes as a base material: a woven fabric layer using bulky yarn as at least one of warp and weft; and a nonwoven fabric layer placed on one surface side of the woven fabric layer, a part of the nonwoven fabric layer being embedded in the woven fabric layer. A nonwoven fabric-resin composite layer is formed in an opposite surface of the nonwoven fabric layer from the woven fabric layer by impregnation with resin, and a woven fabric-rubber composite layer is formed in the other surface of the woven fabric layer by impregnation with rubber. The nonwoven fabric-resin composite layer and the woven fabric-rubber composite layer have voids therein.

A method for manufacturing a hot press cushioning material according to the present invention includes the steps of preparing a woven fabric layer using bulky yarn as at least one of warp and weft; placing a nonwoven fabric layer on one surface side of the woven fabric layer and embedding a part of the nonwoven fabric layer into the woven fabric layer; impregnating the stack of the woven fabric layer and the nonwoven fabric layer with resin from an opposite surface of the nonwoven fabric layer from the woven fabric layer to form a nonwoven fabric-resin composite layer; and impregnating the stack with rubber from the other surface of the woven fabric layer to form a woven fabric-rubber composite layer.

According to the hot press cushioning material and the method for manufacturing the same of the present invention, the base material of the cushioning material is the stack of the woven fabric layer using the bulky yarn and the nonwoven fabric layer, with a part of the nonwoven fabric layer being embedded in the woven fabric layer. The woven fabric layer and the nonwoven fabric layer are joined together by tangling of fibers, namely without using an adhesive, and the fibers can be prevented from coming off from the nonwoven fabric layer. Since the nonwoven fabric layer is stacked on the woven fabric layer using the bulky yarn, the hot press cushioning material is flexible at its surface and can absorb fine unevenness. Moreover, shape stability can be maintained by the woven fabric using the bulky yarn.

The nonwoven fabric-resin composite layer can prevent fluffing on the surface by the resin with which the nonwoven fabric has been impregnated and can provide release properties as a surface layer of the hot press cushioning material. The resin does not completely fill the voids in the nonwoven fabric and the nonwoven fabric-resin composite layer has a certain level of void properties. The hot press cushioning material is therefore flexible at its surface and can absorb fine unevenness.

When the woven fabric is impregnated with the rubber, the rubber enters the voids of the bulky yarn and the voids in the weave as appropriate. The rubber does not completely fill the voids and the woven fabric-rubber composite layer has a certain level of void properties. This provides satisfactory cushioning properties. Since the rubber protects the fibers and joins the contact points between the fibers, breakage of the fibers and what is called loss of resilience are prevented, and the void properties can be maintained and thus satisfactory cushioning properties can be maintained even after repeated use for a plurality of hot presses. Accordingly, the hot press cushioning material of the present invention has improved conformability to fine unevenness and can be used repeatedly.

In the hot press cushioning material of the present invention, a part of the nonwoven fabric layer may be impregnated with the rubber of the woven fabric-rubber composite layer to form a nonwoven fabric-rubber composite layer. In this case, the nonwoven fabric-rubber composite layer has voids therein.

As described above, the hot press cushioning material in which a part of the nonwoven fabric layer has also been impregnated with the rubber of the woven fabric-rubber composite layer also has conformability to fine unevenness and can be used repeatedly. In addition, in the case where the nonwoven fabric layer is also impregnated with the rubber of the rubber layer, the rubber joins the contact points between the fibers of the nonwoven fabric and therefore can prevent loss of resilience of the nonwoven fabric layer. Since the rubber does not completely fill the voids in the nonwoven fabric layer and the nonwoven fabric-rubber composite layer has the voids, satisfactory cushioning properties can be maintained.

In the hot press cushioning material of the present invention, it is preferable that the bulky yarn include at least one kind of fiber selected from glass fiber, meta-aromatic polyamide fiber, para-aromatic polyamide fiber, and polypara phenylene benzobisoxazole fiber. Two or more of these kinds of fiber may be combined or the fiber selected from these kinds may be combined with other fiber. Among these, glass fiber is particularly preferred. Glass fiber has heat resistance and the dimensions of glass fiber changes only slightly by heat. Accordingly, in the case where the bulky yarn is glass fiber, shape stability of the hot press cushioning material can be more satisfactorily maintained even after repeated use.

In the hot press cushioning material of the present invention, it is preferable that the rubber with which the woven fabric layer is impregnated include at least one kind of rubber selected from fluororubber, EPM, EPDM, hydrogenated nitrile rubber, silicone rubber, acrylic rubber, and butyl rubber. Two or more of these kinds of rubber may be mixed or the rubber selected from these kinds may be mixed with other rubber. Among these, fluororubber is particularly preferred. Fluororubber has excellent physical properties such as heat resistance and strength. Accordingly, in the case where the rubber of the rubber layer is fluororubber, properties of the hot press cushioning material can be improved.

In the hot press cushioning material of the present invention, it is preferable that nonwoven fabric of the nonwoven fabric layer include at least one kind of fiber selected from meta-aromatic polyamide fiber, para-aromatic polyamide fiber, and polypara phenylene benzobisoxazole fiber. Two or more of these kinds of fiber may be combined or the fiber selected from these kinds may be combined with other fiber. Among these, meta- or para-aromatic polyamide fiber is particularly preferred. Aromatic polyamide fiber has excellent physical properties such as flexibility and heat resistance. Accordingly, in the case where the nonwoven fabric of the nonwoven fabric layer is aromatic polyamide fiber, properties and conformability to fine unevenness of the hot press cushioning material can be improved.

In the hot press cushioning material of the present invention, it is preferable that the resin with which the nonwoven fabric layer is impregnated include at least one kind of resin selected from polyimide resin, fluororesin, phenol resin, melamine resin, epoxy resin, unsaturated polyester resin, silicone resin, thermosetting acrylic resin, furan resin, urea resin, diallyl phthalate resin, and polyurethane resin. Among these, polyimide resin or fluororesin is particularly preferred. Polyimide resin and fluororesin have excellent physical properties such as heat resistance and release properties. Accordingly, properties of the hot press cushioning material can be improved.

Advantageous Effects of Invention

According to the hot press cushioning material and the method for manufacturing the same of the present invention, a hot press cushioning material can be provided which has improved conformability to fine unevenness and which can be used repeatedly.

DESCRIPTION OF EMBODIMENTS

Figure 1:
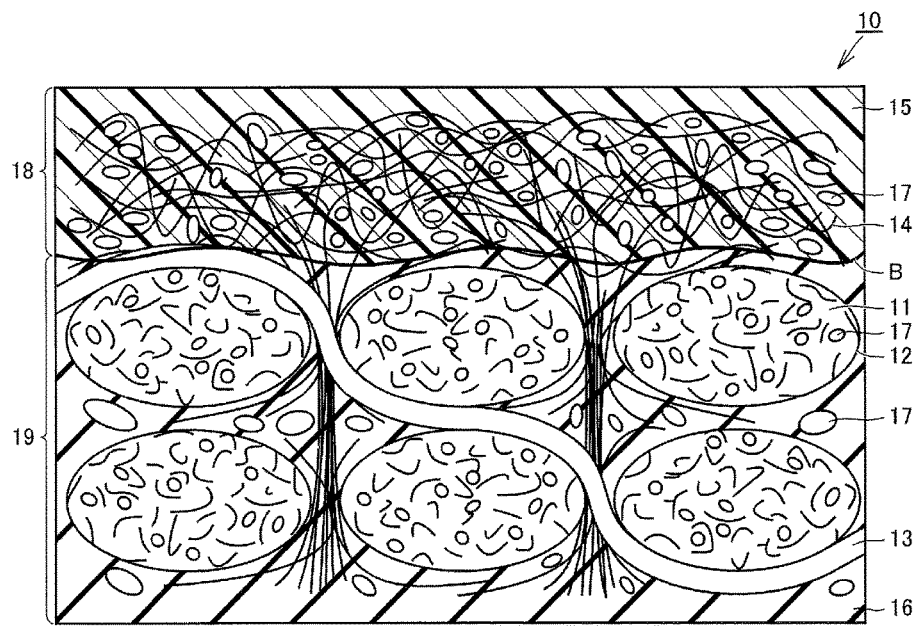
FIG. 1 is a schematic sectional view of a hot press cushioning material according to an embodiment of the present invention taken along a thickness direction.

Embodiments of the present invention will be described below with reference to the accompanying drawings. In the figures described below, the same or corresponding portions are denoted with the same reference characters, and description thereof will not be repeated.

A hot press cushioning material 10 according to an embodiment of the present invention will be described with reference to FIGS. 1 to 7. For better understanding, the rubber 16 is not shown hatched in the woven fabric layer 11 in the woven fabric-rubber composite layer 19 of FIGS. 1 to 7, and the resin 15 is not shown hatched in the woven fabric layer 11 in the woven fabric-resin composite layer 20 of FIG. 2.

As shown in FIGS. 1 to 7, the hot press cushioning material 10 of the embodiment of the present invention includes, as a base material, a woven fabric layer 11 and a nonwoven fabric layer 14. The hot press cushioning material 10 has a nonwoven fabric-resin composite layer 18 at least in its surface (the upper surface in the figures) on the nonwoven fabric layer 14 side and has a woven fabric-rubber composite layer 19 at least in its surface (the lower surface in the figures) on the woven fabric layer 11 side.

Bulky yarn 12 is used as at least one of warp and weft of the woven fabric layer 11. That is, bulky yarn may be used as either one or both of the warp and weft of woven fabric. In the case where bulky yarn is used as one of the warp and weft, normal single yarn or double twisted yarn can be used as the other. In the present embodiment, as shown in FIGS. 1 to 7, the bulky yarn 12 is used as the warp and double twisted yarn 13 is used as the weft.

The layer structure of the woven fabric may be either a single weave structure or a multiple weave structure. Weaving methods include plain weave, twill weave, and other weaves. However, the present invention is not limited to a specific weaving method. The basis weight and the void properties of the woven fabric can be adjusted by selecting a yarn count, a weave density, a weaving method, etc. as appropriate. It is preferable that the basis weight of the woven fabric of the woven fabric layer 11 be 500 g/m$^2$ or more and 2,000 g/m$^2$ or less. A hot press cushioning material having high dimensional stability, high durability, and high in-plane uniformity can be produced by using woven fabric of such basis weight.

The bulky yarn 12 is yarn occupying a large area, in which short fibers forming bulky yarn are not parallel to each other but are tangled and are arranged in a disordered state. In other words, the bulky yarn is bulky like wool yarn. Therefore, unlike a normal woven fabric, the woven fabric using the bulky yarn has many voids therein. Although not particularly limited, the bulky yarn may be made of glass fiber, meta-aromatic polyamide fiber, para-aromatic polyamide fiber, polypara phenylene benzobisoxazole (PBO) fiber, etc., and is preferably made of glass fiber.

For example, the types of the bulky yarn 12 include bulked yarn, staple yarn, sliver yarn, etc. The bulked yarn is yarn bulked by air jet processing etc. The staple yarn is yarn produced by spinning cotton-like glass short fibers into a thread. The sliver yarn is yarn produced by twisting untwisted bulky short fibers (slivers). The bulky yarn 12 is preferably bulked yarn. The bulked yarn is processed yarn made bulky like wool yarn by opening fibers of single yarn or bulking double twisted yarn by air jet processing. The woven fabric using the bulked yarn therefore has a high void ratio and can be appropriately impregnated with rubber and resin. For example, A305, A330, A400, A415, A450, A500, T330, T540, T790, T860, and T900 made by Unitika Ltd., KS4010, KS4155, and KS4325 made by Nitto Boseki Co., Ltd., etc. can be used as the woven fabric using bulked yarn of glass fiber.

The nonwoven fabric layer 14 is placed on one surface side of the woven fabric layer 11 (the upper side of the woven fabric layer 11 in FIGS. 1 to 7), and a part of the nonwoven fabric layer 14 is embedded in the woven fabric layer 11. That is, the woven fabric layer 11 and the nonwoven fabric layer 14 are not bonded together with an adhesive etc., but a part of fibers of the nonwoven fabric is embedded in the woven fabric layer 11 by, e.g., punching such as needle punching or water punching. The woven fabric and the nonwoven fabric are therefore tangled with each other without using any other member. The nonwoven fabric is more flexible than the woven fabric.

The nonwoven fabric layer 14 is a thin film-like sheet made of only fiber and is also called a web. The nonwoven fabric layer 14 is comprised of organic fiber. Although not particularly limited, the organic fiber may be, e.g., meta-aromatic polyamide fiber, para-aromatic polyamide fiber, polypara phenylene benzobisoxazole fiber, etc., and meta- or para-aromatic polyamide fiber is particularly preferred.

The basis weight of the nonwoven fabric of the nonwoven fabric layer 14 is preferably 10 g/m$^2$ or more and 300 g/m$^2$ or less, and more preferably 30 g/m$^2$ or more and 100 g/m$^2$ or less. Improved conformability to fine unevenness is achieved in the case where the basis weight is 10 g/m$^2$ or more, and further improved conformability to fine unevenness is achieved in the case where the basis weight is 30 g/m$^2$ or more. The risk of loss of resilience of the nonwoven fabric layer 14 after repeated use for hot press can be reduced in the case where the basis weight is 300 g/m$^2$ or less, and this risk can further be reduced in the case where the basis weight is 100 g/m$^2$ or less. In the hot press cushioning material of the present invention, the basis weight of the nonwoven fabric layer 14 is made sufficiently lighter than that of the woven fabric 11. Conformability to fine unevenness can therefore be improved by the nonwoven fabric layer 14 without affecting dimensional stability, durability, and in-plane uniformity.

The hot press cushioning material 10 has the nonwoven fabric-resin composite layer 18 at least in the opposite surface (the upper surface in FIGS. 1 to 7) of the nonwoven fabric layer 14 from the woven fabric layer 11. The fibers of the nonwoven fabric layer 14 are therefore not exposed and fluffing is restrained.

Although not particularly limited, resin 15 with which the nonwoven fabric is impregnated to form the nonwoven fabric-resin composite layer 18 may be, e.g., polyimide resin, fluororesin, phenol resin, melamine resin, epoxy resin, unsaturated polyester resin, silicone resin, thermosetting acrylic resin, furan resin, urea resin, diallyl phthalate resin, polyurethane resin, etc., and polyimide resin or fluororesin is particularly preferred.

The hot press cushioning material 10 has the woven fabric-rubber composite layer 19 on the other surface side (the lower side in FIGS. 1 to 7) of the woven fabric layer 11, namely at least in the opposite surface of the woven fabric layer 11 from the nonwoven fabric layer 14. The woven fabric of the woven fabric layer 11 is therefore not exposed.

Although not particularly limited, rubber 16 with which the woven fabric is impregnated to form the woven fabric-rubber composite layer 19 may be, e.g., fluororubber, EPM, EPDM, hydrogenated nitrile rubber, silicone rubber, acrylic rubber, butyl rubber, etc., and fluororubber is particularly preferred.

Figure 2:
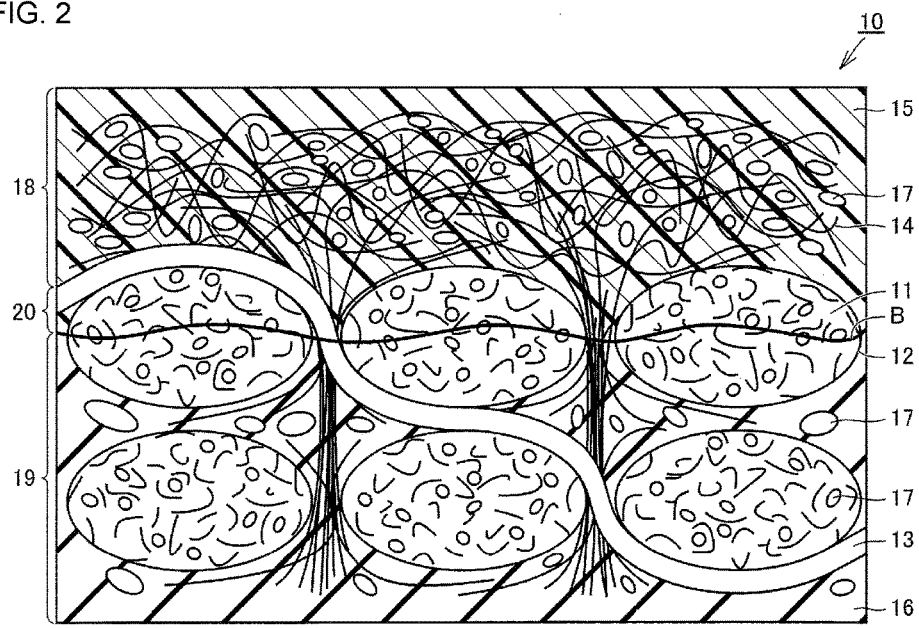
FIG. 2 is a schematic sectional view of a hot press cushioning material according to another embodiment of the present invention taken along a thickness direction.
Figure 3:
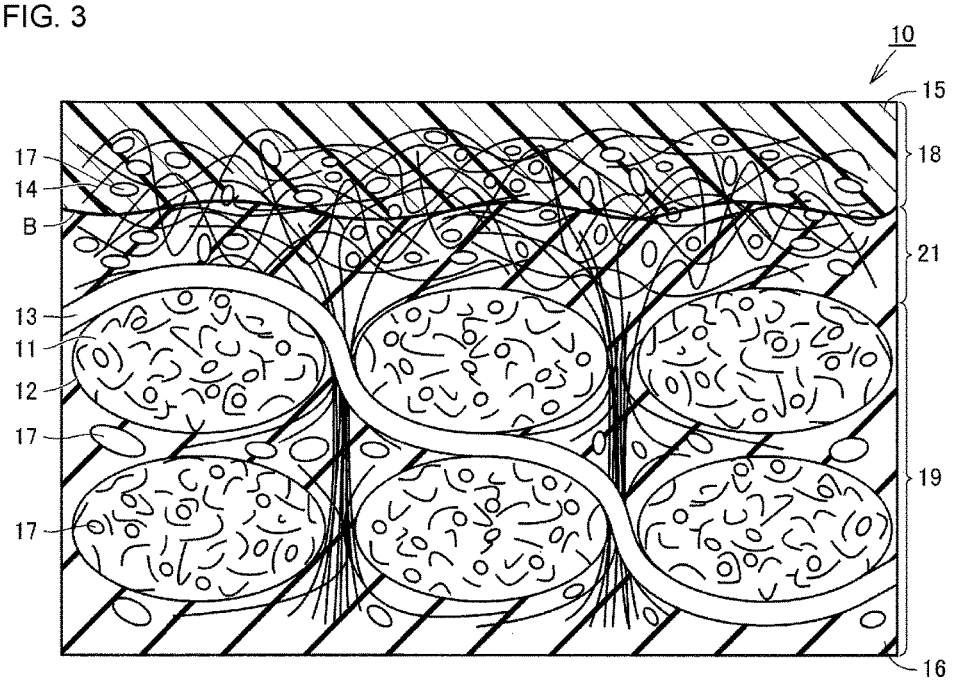
FIG. 3 is a schematic sectional view of a hot press cushioning material according to still another embodiment of the present invention taken along a thickness direction.

As shown in FIGS. 1 to 7, the nonwoven fabric layer 14 is impregnated with the resin 15 to form the nonwoven fabric-resin composite layer 18. The woven fabric layer 11 is impregnated with the rubber 16 to form the woven fabric-rubber composite layer 19, as shown in FIGS. 1 to 7. That is, the stack of the woven fabric layer 11 and the nonwoven fabric layer 14 is impregnated with the resin 15 from the nonwoven fabric layer 14 side and is impregnated with the rubber 16 from the woven fabric layer 11 side. The boundary between the resin 15 and the rubber 16 is therefore not limited to a particular position and may be a position shifted in the vertical direction from the position of an interface B shown in FIG. 1. The boundary between the resin 15 and the rubber 16 shifted downward from FIG. 1 is shown in FIG. 2, and the boundary shifted upward from FIG. 1 is shown in FIG. 3. An interface B1 of the resin 15 and an interface B2 of the rubber 16 may be in contact with each other as shown in FIGS. 1 to 3 or may not be in contact with each other as shown in FIGS. 4 to 7. The structures of FIGS. 1 to 7 are shown by way of example only.

The nonwoven fabric-resin composite layer 18 and the woven fabric-rubber composite layer 19 have voids 17 therein. The voids 17 serve as a cushion. The nonwoven fabric-resin composite layer 18 and the woven fabric-rubber composite layer 19 preferably have a void-to-volume ratio of 20% or more and 70% or less.

Specifically, in the structure shown in FIG. 1, the interface of the resin 15 is in contact with the interface B of the rubber 16, and the boundary between the resin 15 and the rubber 16 is located at the boundary between the nonwoven fabric layer 14 and the woven fabric layer 11. The hot press cushioning material 10 shown in FIG. 1 thus includes the woven fabric-rubber composite layer 19 and the nonwoven fabric-resin composite layer 18 formed on the woven fabric-rubber composite layer 19. The nonwoven fabric-resin composite layer 18 and the woven fabric-rubber composite layer 19 have the voids 17 therein. The woven fabric-rubber composite layer 19 contains the fibers of the nonwoven fabric which have been embedded therein.

In the structure shown in FIG. 2, the interface of the resin 15 is in contact with the interface B of the rubber 16, and the boundary between the resin 15 and the rubber 16 is located in the woven fabric layer 11. That is, the nonwoven fabric layer 14 and the woven fabric layer 11 are impregnated with the resin 15 to form the nonwoven fabric-resin composite layer 18 and a woven fabric-resin composite layer 20. The hot press cushioning material 10 shown in FIG. 2 thus includes the woven fabric-rubber composite layer 19, the woven fabric-resin composite layer 20 formed on the woven fabric-rubber composite layer 19, and the nonwoven fabric-resin composite layer 18 formed on the woven fabric-resin composite layer 20. The nonwoven fabric-resin composite layer 18, the woven fabric-rubber composite layer 19, and the woven fabric-resin composite layer 20 have the voids 17 therein. The woven fabric-rubber composite layer 19 and the woven fabric-resin composite layer 20 contain the fibers of the nonwoven fabric which have been embedded therein.

In the structure shown in FIG. 3, the interface of the resin 15 is in contact with the interface B of the rubber 16, and the boundary between the resin 15 and the rubber 16 is located in the nonwoven fabric layer 14. That is, the woven fabric layer 11 and the nonwoven fabric layer 14 are impregnated with the rubber 16 to form the woven fabric-rubber composite layer 19 and a nonwoven fabric-rubber composite layer 21. The hot press cushioning material 10 shown in FIG. 3 thus includes the woven fabric-rubber composite layer 19, the nonwoven fabric-rubber composite layer 21 formed on the woven fabric-rubber composite layer 19, and the nonwoven fabric-resin composite layer 18 formed on the nonwoven fabric-rubber composite layer 21. The nonwoven fabric-resin composite layer 18, the woven fabric-rubber composite layer 19, and the nonwoven fabric-rubber composite layer 21 have the voids 17 therein. The woven fabric-rubber composite layer 19 contains the fibers of the nonwoven fabric which have been embedded therein.

Figure 4:
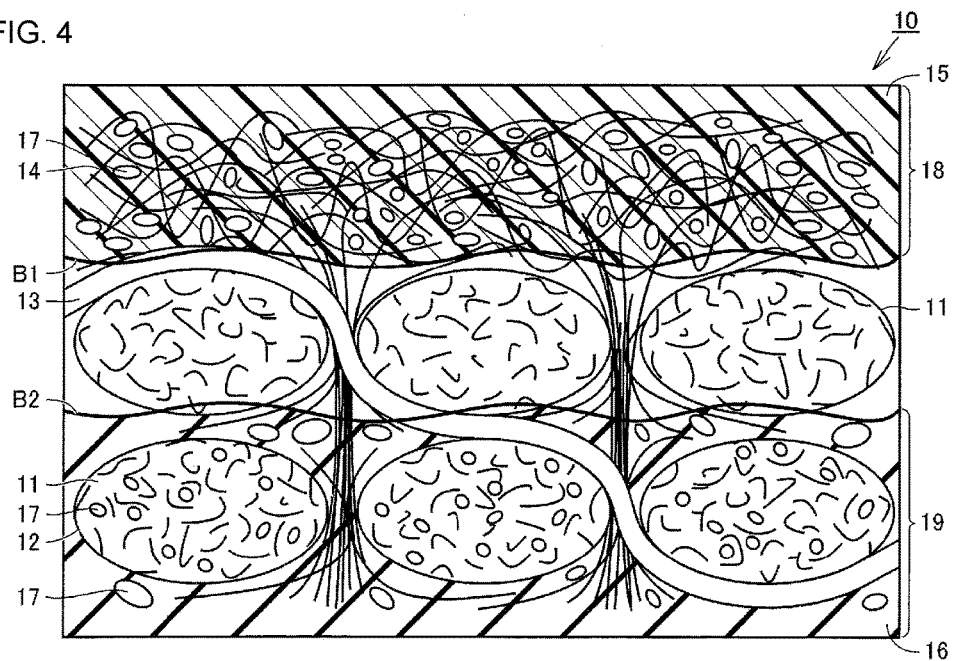
FIG. 4 is a schematic sectional view of a hot press cushioning material according to yet another embodiment of the present invention taken along a thickness direction.

In the structure shown in FIG. 4, the interface B1 of the resin 15 is not in contact with the interface B2 of the rubber 16, and the interface B1 of the resin 15 is located at the boundary between the woven fabric layer 11 and the nonwoven fabric layer 14, and the interface B2 of the rubber 16 is located in the woven fabric layer 11. That is, the woven fabric layer 11 has a region impregnated with neither the rubber 16 nor the resin 15. The hot press cushioning material 10 shown in FIG. 4 thus includes the woven fabric-rubber composite layer 19, the woven fabric layer 11 formed on the woven fabric-rubber composite layer 19, and the nonwoven fabric-resin composite layer 18 formed on the woven fabric layer 11. The nonwoven fabric-resin composite layer 18 and the woven fabric-rubber composite layer 19 have the voids 17 therein. The woven fabric-rubber composite layer 19 contains the fibers of the nonwoven fabric which have been embedded therein.

Figure 5:
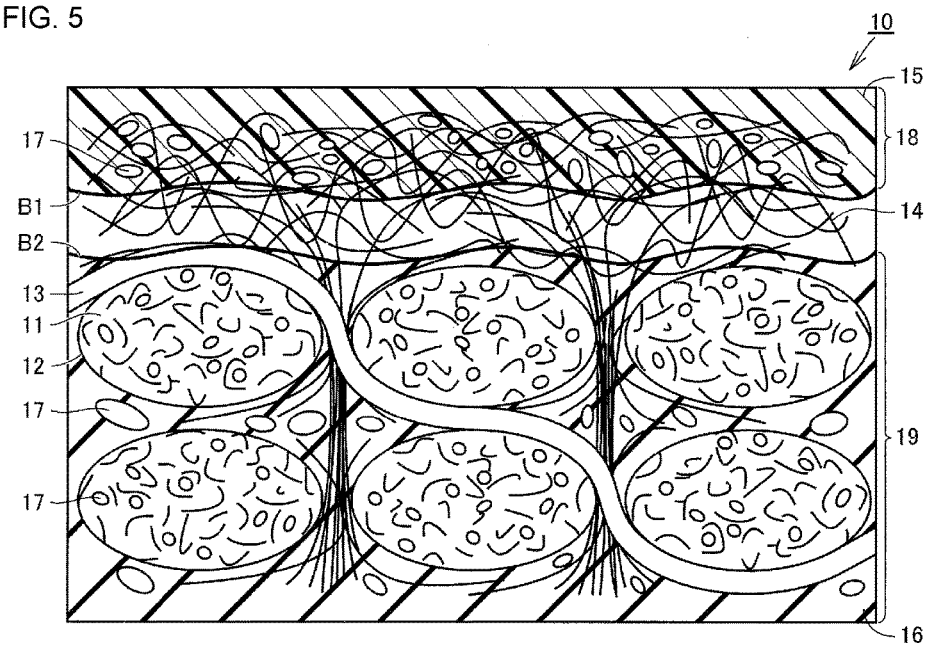
FIG. 5 is a schematic sectional view of a hot press cushioning material according to a further embodiment of the present invention taken along a thickness direction.

In the structure shown in FIG. 5, the interface B1 of the resin 15 is not in contact with the interface B2 of the rubber 16, and the interface B1 of the resin 15 is located in the nonwoven fabric layer 14, and the interface B2 of the rubber 16 is located at the boundary between the nonwoven fabric layer 14 and the woven fabric layer 11. That is, the nonwoven fabric layer 14 has a region impregnated with neither the rubber 16 nor the resin 15. The hot press cushioning material 10 shown in FIG. 4 thus includes the woven fabric-rubber composite layer 19, the nonwoven fabric layer 14 formed on the woven fabric-rubber composite layer 19, and the nonwoven fabric-resin composite layer 18 formed on the nonwoven fabric layer 14. The nonwoven fabric-resin composite layer 18 and the woven fabric-rubber composite layer 19 have the voids 17 therein. The woven fabric-rubber composite layer 19 contains the fibers of the nonwoven fabric which have been embedded therein.

Figure 6:
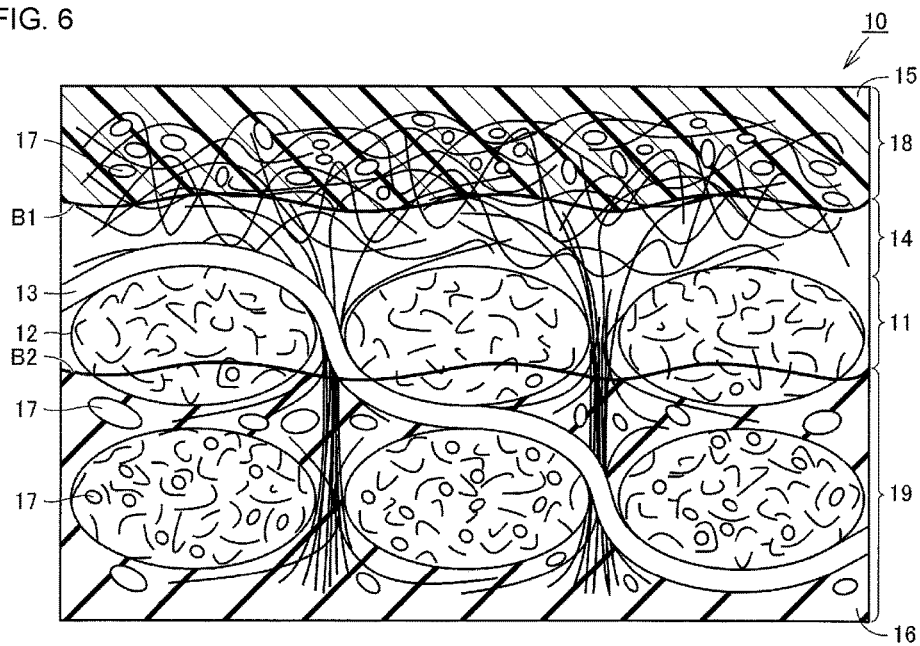
FIG. 6 is a schematic sectional view of a hot press cushioning material according to a still further embodiment of the present invention taken along a thickness direction.
Figure 7:
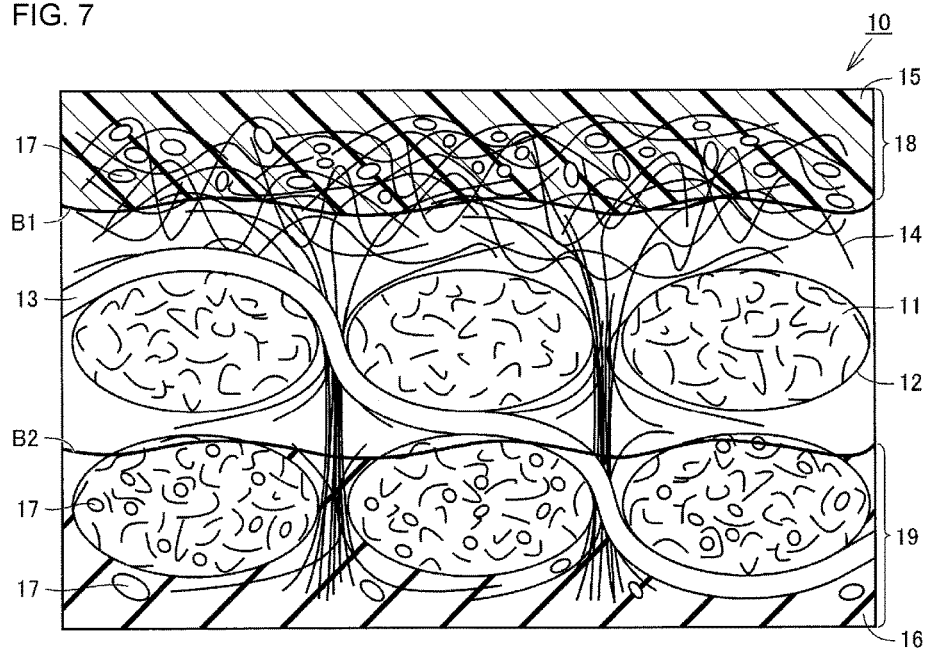
FIG. 7 is a schematic sectional view of a hot press cushioning material according to a yet further embodiment of the present invention taken along a thickness direction.

In the structures shown in FIGS. 6 and 7, the interface B1 of the resin 15 is not in contact with the interface B2 of the rubber 16, and the interface B1 of the resin 15 is located in the nonwoven fabric layer 14, and the interface B2 of the rubber 16 is located in the woven fabric layer 11. That is, each of the nonwoven fabric layer 14 and the woven fabric layer 11 has a region impregnated with neither the rubber 16 nor the resin 15. The hot press cushioning materials 10 shown in FIGS. 6 and 7 thus include the woven fabric-rubber composite layer 19, the woven fabric layer 11 formed on the woven fabric-rubber composite layer 19, the nonwoven fabric layer 14 formed on the woven fabric layer 11, and the nonwoven fabric-resin composite layer 18 formed on the nonwoven fabric layer 14. The nonwoven fabric-resin composite layer 18 and the woven fabric-rubber composite layer 19 have the voids 17 therein. The woven fabric-rubber composite layer 19 contains the fibers of the nonwoven fabric which have been embedded therein. The thickness of the woven fabric layer 11 impregnated with neither the rubber 16 and the resin 15 in the hot press cushioning material 10 shown in FIG. 6 is smaller than that of the woven fabric layer 11 impregnated with neither the rubber 16 and the resin 15 in the hot press cushioning material 10 shown in FIG. 7.

A method for manufacturing the hot press cushioning material 10 of the embodiment will be described below with reference to FIGS. 1 to 8.

Figure 8:
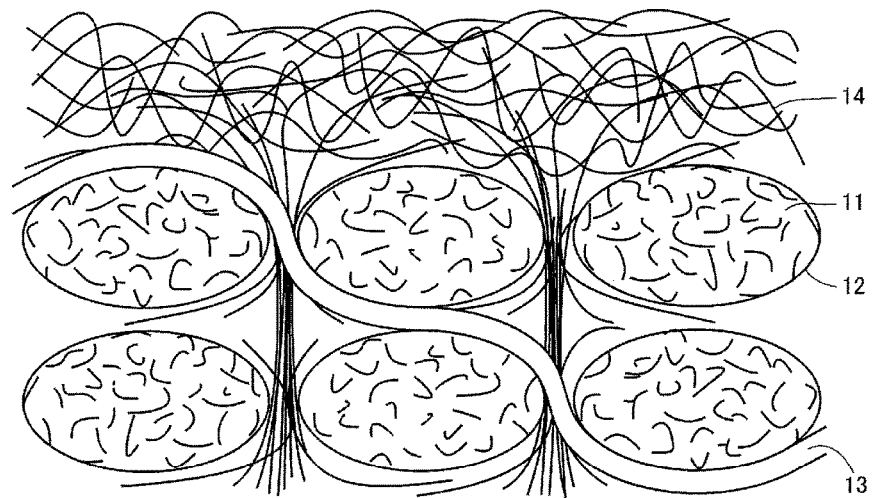
FIG. 8 is a schematic sectional view showing a part of a nonwoven fabric layer being embedded in a woven fabric layer according to an embodiment of the present invention, taken along a thickness direction.

First, the woven fabric layer 11 using the bulky yarn 12 as at least one of warp and weft is prepared as shown in FIG. 8. In this step, a sheet-like woven fabric comprised of a material such as those described above is prepared.

Next, as shown in FIG. 8, the nonwoven fabric layer 14 is placed on one surface side of the woven fabric layer 11 and a part of the nonwoven fabric layer 14 is embedded into the woven fabric layer 11. In this step, a web comprised of a material such as those described above is placed like a sheet on one surface side of the woven fabric layer 11, and a part of fibers of the web is embedded in the woven fabric by, e.g., punching such as needle punching or water punching to join the nonwoven fabric layer 14 and the woven fabric layer 11.

Then, as shown in FIGS. 1 to 7, the stack of the woven fabric layer 11 and the nonwoven fabric layer 14 is impregnated with the resin 15 from the nonwoven fabric layer 14 side. In this step, a resin dissolved in a solvent, a resin in the form of varnish, etc. is preferably used so as to facilitate impregnation of the nonwoven fabric with the resin 15.

In this step, the impregnation with the resin 15 is performed from the nonwoven fabric layer 14 side so that the resin 15 does not penetrate to the other surface side of the woven fabric layer 11 (the opposite side of the woven fabric layer 11 from the nonwoven fabric layer 14). That is, the impregnation with the resin 15 is performed so that the bulky yarn 12 of the woven fabric layer 11 is exposed from the opposite surface of the woven fabric layer 11 from the nonwoven fabric layer 14. The nonwoven fabric-resin composite layer 18 shown in FIGS. 1 to 7 can be formed by this step.

In this step, the nonwoven fabric layer 14 and a part of the woven fabric layer 11 may be impregnated with the resin 15. Namely, the impregnation with the resin 15 may be performed so that the side of the woven fabric layer 11 which faces the nonwoven fabric layer 14 is impregnated with the resin 15 and the bulky yarn 12 of the woven fabric layer 11 is exposed from the opposite surface of the woven fabric layer 11 from the nonwoven fabric layer 14 is exposed. As shown in FIG. 2, the woven fabric-resin composite layer 20 can thus be formed.

In this step, the entire nonwoven fabric layer 14 may be impregnated with the resin 15 as shown in FIGS. 1, 2, and 4, or a part of the nonwoven fabric layer 14 may be impregnated with the resin 15 as shown in FIGS. 3 and 5 to 7.

The depth to which the impregnation with the resin 15 is performed can be adjusted as desired by changing the viscosity of the resin varnish as appropriate.

Subsequently, the stack of the woven fabric layer 11 and the nonwoven fabric layer 14 is impregnated with the rubber 16 from the woven fabric layer 11 side (the other surface side of the woven fabric layer 11). This step includes the steps of causing an unvulcanized rubber solution to penetrate the stack of the woven fabric layer 11 and the nonwoven fabric layer 14 from the other surface side of the woven fabric layer 11, drying the unvulcanized rubber solution having penetrated the woven fabric layer 11, and vulcanizing the dried unvulcanized rubber. The woven fabric-rubber composite layer 19 shown in FIGS. 1 to 7 can be formed by this step.

In this step, the woven fabric layer 11 and a part of the nonwoven fabric layer 14 may be impregnated with the rubber 16. In this case, as shown in FIG. 3, the woven fabric-rubber composite layer 19 and the nonwoven fabric-rubber composite layer 21 can be formed.

As in the case of the impregnation with the rubber 15, the depth to which the impregnation with the rubber 16 is performed can also be adjusted as desired by changing the viscosity of the unvulcanized rubber solution as appropriate.

In FIGS. 1 to 7, the stack of the woven fabric layer 11 and the nonwoven fabric layer 14 is impregnated with the resin 15 from the upper side (the nonwoven fabric layer 14 side) and is impregnated with the rubber 16 from the lower side (the woven fabric layer 11 side). The woven fabric layer 11 and the nonwoven fabric layer 14 have voids. When the step of the impregnation with the resin 15 and the step of the impregnation with the rubber 16 are performed, the resin 15 or the rubber 16 enters the voids. However, the resin 15 or the rubber 16 does not completely fill the voids, and a certain level of void properties is maintained. The nonwoven fabric-resin composite layer 18, the woven fabric-rubber composite layer 19, the woven fabric-resin composite layer 20, and the nonwoven fabric-rubber composite layer 21 which are formed by impregnating the woven fabric layer 11 and/or the nonwoven fabric layer 14 with the resin 15 or the rubber 16 therefore have the voids 17 therein.

The hot press cushioning material 10 shown in FIGS. 1 to 7 can be manufactured by performing the steps described above. The hot press cushioning material 10 thus manufactured may be used alone. Alternatively, as shown in FIGS. 9 to 12, the hot press cushioning material 10 and other material(s) are stacked and the stack thus obtained may be used as a hot press cushioning material. Each of the hot press cushioning materials shown in FIGS. 9 to 12 is formed by a stack of the hot press cushioning material 10 shown in FIGS. 1 to 7 and one or more layers made of other material(s).

Figure 9:
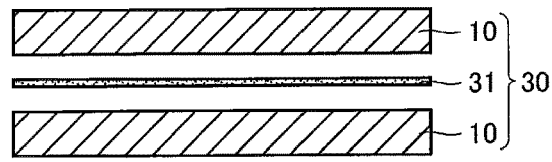
FIG. 9 is a schematic sectional view of a hot press cushioning material according to a yet further embodiment of the present invention taken along a thickness direction.

Specifically, a hot press cushioning material 30 shown in FIG. 9 includes two of the hot press cushioning materials 10 shown in FIGS. 1 to 7 and an adhesive layer 31 placed between the two hot press cushioning materials 10. The woven fabric-rubber composite layers 19 of the two hot press cushioning materials 10 face the adhesive layer 31. For example, the adhesive layer 31 is a layer formed by applying a heat resistant rubber adhesive to both upper and lower surfaces of a base material made of woven fabric.

Figure 10:
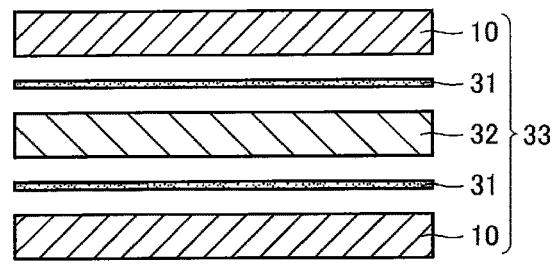
FIG. 10 is a schematic sectional view of a hot press cushioning material according to a yet further embodiment of the present invention taken along a thickness direction.

A hot press cushioning material 33 shown in FIG. 10 includes other cushioning material 32, adhesive layers 31 formed on both upper and lower surfaces of the cushioning material 32, and the hot press cushioning materials 10 of FIGS. 1 to 7 bonded to the adhesive layers 31. Although not particularly limited, the cushioning material 32 is a one or more layered material comprised of one or more selected from woven fabric, nonwoven fabric, paper, a film, foil, a sheet, and a plate. Among these, a material that can be repeatedly used is preferred, and the cushioning material 32 is preferably made of nonwoven fabric, woven fabric, rubber, any of the materials described in Japanese Patent No. 4746523, etc.

Figure 11:
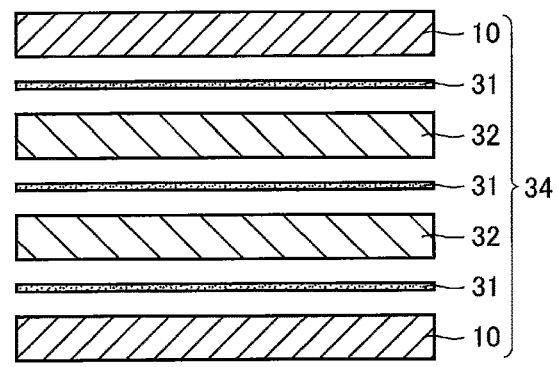
FIG. 11 is a schematic sectional view of a hot press cushioning material according to a yet further embodiment of the present invention taken along a thickness direction.

A hot press cushioning material 34 shown in FIG. 11 includes a plurality of other cushioning materials 32, an adhesive layer 31 bonding the plurality of other cushioning materials 32, the hot press cushioning materials 10 of FIGS. 1 to 7 bonded to the plurality of other cushioning materials 32, and adhesive layers 31 bonding the cushioning materials 32 to the hot press cushioning materials 10. The cushioning materials 32 shown in FIG. 11 are made of the same material and are arranged symmetrically in the vertical direction.

Figure 12:
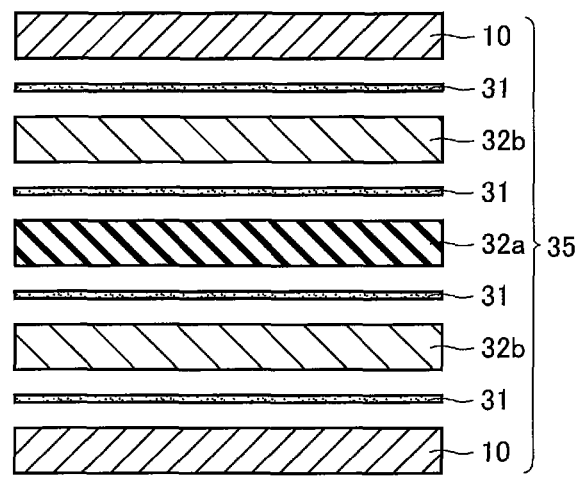
FIG. 12 is a schematic sectional view of a hot press cushioning material according to a yet further embodiment of the present invention taken along a thickness direction.

Other cushioning materials 32 shown in FIG. 12 are comprised of the cushioning materials 32 of FIG. 11 which are made of a plurality of materials (a first cushioning material 32a and second cushioning materials 32b). Specifically, a hot press cushioning material shown in FIG. 12 includes a first cushioning material 32a, adhesive layers 31 formed on both upper and lower surfaces of the first cushioning material 32a, second cushioning materials 32b bonded to the adhesive layers 31, adhesive layers 31 formed on the outer surfaces of the second cushioning materials 32b, and the hot press cushioning materials 10 of FIGS. 1 to 7 bonded to the adhesive layers 31. The hot press cushioning material 35 shown in FIG. 12 is symmetrical in the vertical direction.

In the case of manufacturing the hot press cushioning materials of FIGS. 9 to 12 in which the hot press cushioning materials of FIGS. 1 to 7 and other material(s) are stacked, the hot press cushioning materials 10 are placed such that their woven fabric-rubber composite layers 19 face this other material(s) (in FIGS. 9 to 12, the adhesive layer(s) 31). Accordingly, the hot press cushioning materials 10 of FIGS. 1 to 7 each including the vulcanized woven fabric-rubber composite layer 19 may be bonded to this other material(s).

Alternatively, the hot press cushioning materials 10 of FIGS. 1 to 7 each including the unvulcanized woven fabric-rubber composite layer 19 and this other material(s) may be stacked and this stack may be press vulcanized so that the hot press cushioning materials 10 of FIGS. 1 to 7 and this other material(s) may be joined and vulcanized at the same time.

The hot press cushioning materials 30, 33 to 35 of FIGS. 9 to 12 are shown by way of example only. The hot press cushioning material of the present invention need only include the hot press cushioning material 10 shown in FIGS. 1 to 7, and any other layer(s) of the hot press cushioning material of the present invention may be formed as desired or may be omitted.

As shown in FIGS. 9 to 12, in the case of the hot press cushioning material in which the hot press cushioning materials of FIGS. 1 to 7 and other material(s) are stacked, the hot press cushioning materials 10 of FIGS. 1 to 7 are placed in the outermost layers such that the nonwoven fabric-resin composite layers 18 serve as the surface layers of the whole cushioning material. A hot press cushioning material having excellent conformability to fine unevenness can thus be produced.

Figure 16:
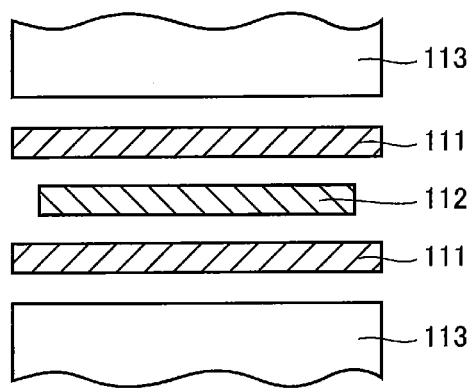
FIG. 16 is a schematic view illustrating hot press.

As in conventional examples, the hot press cushioning materials 10, 30, 33 to 35 of the embodiments shown in FIGS. 1 to 12 can be used in such a manner as shown in FIG. 16 when press forming or thermocompression bonding is performed to manufacture a laminate such as a printed circuit board. When hot press is performed with the hot press cushioning material 10, 30, 33 to 35 interposed between each heating platen 113 and the laminate material 112, fine unevenness such as small warps or flaws of the heating platens can be absorbed, and conformability to fine unevenness can thus be improved. The hot press cushioning materials 10, 30, 33 to 35 of the embodiments shown in FIGS. 1 to 12 can be repeatedly used for hot press. The hot press cushioning materials 10, 30, 33 to 35 of the embodiments are therefore preferably used to perform press forming or thermocompression bonding to produce a laminate for which high precision is required.

EXAMPLES

The present invention will be described in more detail with respect to examples. However, the present invention is not limited to the following examples.

Example 1

Glass woven fabric "T860" using bulky yarn (made by Unitika Ltd.) was prepared as a woven fabric layer. The weft of the woven fabric was bulky yarn formed by bulking 305-tex double twisted yarn of 3,200 E-glass fibers (fiber diameter: 6 μm), and the warp thereof was 135-tex unbulked double twisted yarn of 1,600 E-glass fibers (fiber diameter: 6 μm). The woven fabric was formed by weaving the warp and weft in double weave. The woven fabric had a basis weight of 850 g/m$^2$.

A web of "Technora" (made by TEIJIN LIMITED) using para-aromatic polyamide fiber was prepared as a nonwoven fabric layer. The basis weight of the web was 70 g/m$^2$. The web was placed on one surface side of the woven fabric layer and a part of fibers forming the web was embedded into the woven fabric layer by needle punching. The woven fabric layer and the nonwoven fabric layer were thus stacked to form a base material with an integrated structure of the woven fabric layer and the nonwoven fabric layer.

Polyimide resin in the form of varnish was then applied to the base material from the surface side of the nonwoven fabric layer (the opposite side of the nonwoven fabric layer from the woven fabric layer), and the resultant base material was dried and baked. The nonwoven fabric layer was thus impregnated with the polyimide resin to form a nonwoven fabric-resin composite layer.

Subsequently, an unvulcanized fluororubber solution was applied to the base material from the surface side of the woven fabric layer (the other surface side of the woven fabric layer (the opposite side of the woven fabric layer from the nonwoven fabric layer), and the resultant base material was dried. The woven fabric layer was thus impregnated with the unvulcanized fluororubber. Thereafter, the base material was baked at 230° C. for five hours to vulcanize the fluororubber. A woven fabric-rubber composite layer was formed in this manner.

By performing the above process, the hot press cushioning material 10 including the woven fabric-rubber composite layer 19 having the voids 17 and having a part of the fibers of the nonwoven fabric embedded therein, the nonwoven fabric layer 14 formed on the woven fabric-rubber composite layer 19, and the nonwoven fabric-resin composite layer 18 formed on the nonwoven fabric layer 14 and having the voids as shown in FIG. 5 was produced as a hot press cushioning material body.

Two of the hot press cushioning material bodies were produced. As shown in FIG. 9, the two hot press cushioning material bodies were placed such that their woven fabric-rubber composite layers 19 faced each other, and were bonded together with the adhesive layer 31. The adhesive layer 31 was a glass cloth base material with its both upper and lower surfaces coated with a fluororubber adhesive. A hot press cushioning material of Example 1 was manufactured in this manner.

Example 2

A hot press cushioning material of Example 2 was basically manufactured in a manner similar to that of Example 1, but was different from Example 1 in that fluororesin in the form of varnish was used instead of the polyimide resin to impregnate the nonwoven fabric layer. The nonwoven fabric layer was impregnated with the fluororesin and the woven fabric layer was impregnated with the fluororubber. A hot press cushioning material body was thus produced which included the woven fabric-rubber composite layer 19 having the voids 17 and having a part of the fibers of the nonwoven fabric embedded therein and the nonwoven fabric-resin composite layer 18 formed on the woven fabric-rubber composite layer 19 and having the voids 17 as shown in FIG. 1. Unlike Example 1, in the hot press cushioning material body of Example 2, the interface of the fluororesin with which the nonwoven fabric layer was impregnated and the interface of the fluororubber with which the woven fabric layer was impregnated were in contact with each other at the boundary between the nonwoven fabric layer and the woven fabric layer.

Two of the hot press cushioning material bodies were produced, and the hot press cushioning material of Example 2 having the structure shown in FIG. 9 was manufactured in a manner similar to that of Example 1.

Comparative Example 1

Figure 13:
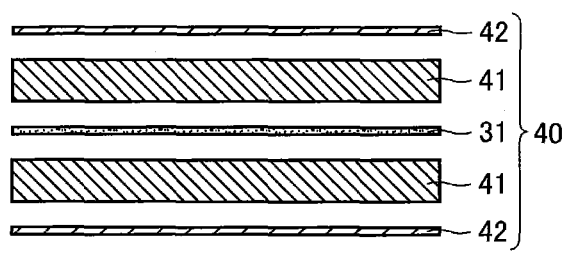
FIG. 13 is a schematic sectional view of a hot press cushioning material according to first to third comparative examples taken along a thickness direction.

A hot press cushioning material of Comparative Example 1 included two cushioning material bodies 41, two surface layer materials 42 placed on the outside of the cushioning material bodies 41, and an adhesive material layer 31 bonding the two cushioning material bodies, as shown in FIG. 13.

Each of the cushioning material bodies 41 was produced as follows. First, glass woven fabric "T860" using bulky yarn (made by Unitika Ltd.) was prepared and impregnated with an unvulcanized fluororubber solution. The resultant glass woven fabric was sufficiently dried to remove the solvent. The dried glass woven fabric was baked at 230° C. for five hours. The cushioning material body 41 was thus produced. This cushioning material body 41 was a woven fabric-rubber composite having voids. See Japanese Patent No. 4746523 for the details of the configuration of the cushioning material body of Comparative Example 1 and the manufacturing method thereof.

Each of the surface layer materials 42 was produced as follows. Glass woven fabric "A515" using bulky yarn (made by Unitika Ltd.) was prepared as woven fabric. This woven fabric had a basis weight of 515 g/m$^2$. Fluororesin in the form of varnish was applied to one surface side of the prepared glass woven fabric, and the resultant glass woven fabric was dried and baked. After the baking, unvulcanized fluororubber was applied to the back surface of the glass woven fabric, and the resultant glass woven fabric was dried. This surface layer material 42 included a woven fabric-rubber composite layer and a woven fabric-resin composite layer formed on the woven fabric-rubber composite layer. See Japanese Patent No. 5341733 for the details of the configuration of the surface layer material 42 of Comparative Example 1 and the manufacturing method thereof.

Subsequently, the two cushioning material bodies 41 were placed with the same adhesive layer 31 as that used in Example 1 interposed therebetween, and the two surface layer materials 42 were placed such that their surfaces impregnated with the unvulcanized fluororubber faced the two cushioning material bodies 41. The adhesive layer 31 and the unvulcanized fluororubber of the surface layer materials 42 were vulcanized to bond the surface layer materials 42, the cushioning material bodies 41, and the adhesive layer 31 together.

A hot press cushioning material 40 of Comparative Example 1 shown in FIG. 13 was manufactured by performing the above process.

Comparative Example 2

A hot press cushioning material 40 of Comparative Example 2 had the structure shown in FIG. 13 and was basically manufactured in a manner similar to that of Comparative Example 1. However, the hot press cushioning material 40 of Comparative Example 2 was different from Comparative Example 1 in surface layer materials 42. The surface layer material 42 is formed by a base material, a releasable coating film formed on the front surface of the base material, and a fluororubber adhesive applied to the back surface of the base material. Specifically, the surface layer material 42 was produced as follows. The base material was plain-woven glass cloth having a basis weight of 200 g/m$^2$. This glass cloth was normal glass cloth using no bulky yarn. Regarding the releasable coating film, 65 parts by mass of the solid content of polyimide resin varnish with a solid content of 25 to 35% (RIKACOAT SN-20 made by New Japan Chemical Co., Ltd.) as a base material, 20 parts by mass of fluororesin powder with an average particle size of 5 μm (Lubron L-5 made by DAIKIN INDUSTRIES, LTD) as organic powder, and 15 parts by mass of titanium oxide powder with an average particle size of 0.3 to 0.5 µm (JA-3 made by TAYCA CORPORATION) as inorganic powder were first mixed to produce a mixture.

The mixture thus produced was applied to one surface of the base material by knife coating, and the resultant base material was dried and baked. Unvulcanized fluororubber was applied to the other surface side of the base material, and the resultant base material was dried. The surface layer material 42 was thus produced. Two of the surface layer materials 42 were prepared, and the hot press cushioning material 40 having the structure shown in FIG. 13 was produced in a manner similar to that of Comparative Example 1. The two surface layer materials 42 were placed such that their surfaces having the unvulcanized fluororubber applied thereto faced the two cushioning material bodies 41. See Japanese Patent No. 4183558 for the details of the configuration of the surface layer material 42 of Comparative Example 2 and the manufacturing method thereof.

Comparative Example 3

A hot press cushioning material 40 of Comparative Example 3 had the structure shown in FIG. 13 and was basically manufactured in a manner similar to that of Comparative Example 1. However, the hot press cushioning material 40 of Comparative Example 3 was different from Comparative Example 1 in that the surface layer materials 42 were aromatic polyamide cloth. The aromatic polyamide cloth had a basis weight of 200 g/m².

Comparative Example 4

A hot press cushioning material of Comparative Example 4 had a stacked structure of eight sheets of kraft paper. Each sheet of kraft paper had a basis weight of 190 g/m².

(Evaluation Method)

A compression test using a compression terminal was conducted for the hot press cushioning materials of Examples 1, 2 and Comparative Examples 1 to 4 to evaluate the amount of spot deformation and repeated usability.

Figure 14:
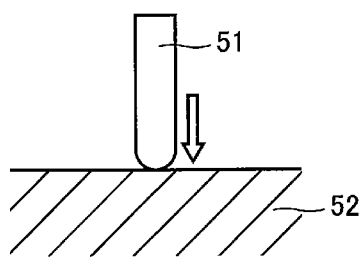
FIG. 14 is a schematic side view showing the state before application of pressure in a compression test of examples.
Figure 15:
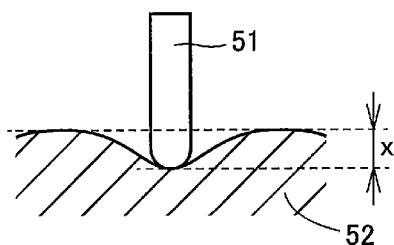
FIG. 15 is a schematic side view showing the state under application of pressure in the compression test of the examples.

Specifically, a compression terminal 51 having a spherical tip end as shown in FIG. 14 was prepared. The tip end of the compression terminal 51 had a diameter of 5 mm. Hot press cushioning materials 52 of Examples 1, 2 and Comparative Examples 1 to 4 were compressed by this compression terminal at 1 mm/min in the direction shown by arrow in FIG. 14 so as to be pressed with a pressure of 0 MPa to 0.5 MPa. The amount of spot deformation x was measured which occurred in the thickness direction of the hot press cushioning material 52 at the time the hot press cushioning material 52 not being pressed as shown in FIG. 14 was pressed with a pressure of 0.5 MPa as shown in FIG. 15.

The hot press cushioning materials of Examples 1, 2 and Comparative Examples 1 to 4 were then pressed one hundred times. The press was performed under the following conditions. First, the hot press cushioning material was placed between heating platens. While being pressed with a pressure of 4 MPa, the hot press cushioning material was heated for 20 minutes from normal temperature to 230° C. The temperature of the hot press cushioning material was maintained at 230° C. for 40 minutes. Subsequently, the hot press cushioning material was cooled for 10 minutes to normal temperature. The pressure was released after the cooling. This was a single press cycle. The amount of spot deformation x that occurred in the thickness direction of the hot press cushioning material when the hot press cushioning material was pressed with a pressure of 0.5 MPa as described above was measured after a single press, 10 presses, and 100 presses. The result is shown in Table 1. In Table 1, "Initial" means the state before hot press.

TABLE 1

|  | Initial (µm) | Single Press (µm) | 10 Presses (µm) | 100 Presses (µm) |
|---|---|---|---|---|
| Example 1 | 741 | 680 | 624 | 564 |
| Example 2 | 763 | 710 | 648 | 580 |
| Comparative Example 1 | 289 | 282 | 276 | 273 |
| Comparative Example 2 | 255 | 247 | 237 | 234 |
| Comparative Example 3 | 252 | 242 | 221 | 213 |
| Comparative Example 4 | 405 | — | — | — |

(Evaluation Result)

Comparative Example 4 had excellent spot deformation properties, but was crushed by a single hot press and was not able to be used repeatedly.

Comparative Examples 1 to 3 had a structure that is conventionally used as a hot press cushioning material with excellent repeated usability. However, Comparative Examples 1 to 3 had a smaller amount of spot deformation than Comparative Example 4 and had poor conformability to fine unevenness.

Examples 1 and 2 included the nonwoven fabric-resin composite layer and the woven fabric-rubber composite layer both having voids. Examples 1 and 2 therefore had a larger amount of spot deformation than Comparative Examples 1 to 4. In Examples 1 and 2, the amount of spot deformation did not decrease so much from the initial amount of spot deformation even after 100 press cycles. Examples 1 and 2 thus had a large amount of spot deformation and therefore had excellent conformability to fine unevenness. Moreover, since a decrease in the amount of spot deformation from the initial value is small, Examples 1 and 2 had excellent repeated usability.

According to the examples of the present invention, it was thus confirmed that a hot press cushioning material having improved conformability to fine unevenness and capable of being repeatedly used can be implemented by impregnating a stack of a nonwoven fabric layer and a fabric layer with resin from the nonwoven fabric layer side to form a nonwoven fabric-resin composite layer and impregnating the stack with rubber from the woven fabric layer side to form a woven fabric-rubber layer.

The embodiments and examples disclosed herein are by way of example in all respects and should not be interpreted as restrictive. The scope of the present invention is defined by the claims rather than the above embodiments and examples, and the invention is intended to cover all modifications and equivalents included within the spirit and scope of the invention as defined by the claims.

REFERENCE SIGNS LIST 10, 30, 33 to 35 hot press cushioning material
11 woven fabric layer
12 bulky yarn
13 double twisted yarn
14 nonwoven fabric layer
15 resin
16 rubber 17 void
18 nonwoven fabric-resin composite layer
19 woven fabric-rubber composite layer
20 woven fabric-resin composite layer
21 nonwoven fabric-rubber composite layer
31 adhesive layer
32 other cushioning material
32a first cushioning material
32b second cushioning material
B, B1, B2 interface

The invention claimed is:

1. A hot press cushioning material comprising:
outer layers and an inner layer interposed between the outer layers, wherein:
each outer layer comprises as a base material:
a woven fabric layer using bulky yarn as at least one of warp and weft; and
a nonwoven fabric layer placed on only one surface side of said woven fabric layer, a part of said nonwoven fabric layer being embedded in said woven fabric layer, wherein:
a nonwoven fabric-resin composite layer is formed in an opposite surface side of said nonwoven fabric layer from said woven fabric layer and includes resin impregnated into space in said nonwoven fabric layer,
a woven fabric-rubber composite layer is formed in the other surface side of said woven fabric layer and includes rubber impregnated into space in said woven fabric layer,
said nonwoven fabric-resin composite layer and said woven fabric-rubber composite layer have voids therein,
said nonwoven fabric-resin composite layer is an utmost outer surface layer of the hot press cushioning material,
said woven-fabric-rubber composite layer faces said inner layer said woven fabric layer comprises a woven fabric having a basis weight of 500 g/m² or more and 2,000 g/m² or less,
said nonwoven fabric layer comprises a nonwoven fabric having a basis weight of 10 g/m² or more and 300 g/m² or less, and,
wherein a void-to-volume ratio of the nonwoven fabric-resin composite layer is 20% or more and 70% or less.

2. The hot press cushioning material according to claim 1, wherein
a part of said nonwoven fabric layer is impregnated with said rubber of said woven fabric-rubber composite layer to form a nonwoven fabric-rubber composite layer, and
said nonwoven fabric-rubber composite layer has voids therein.

3. The hot press cushioning material according to claim 1, wherein
said bulky yarn includes at least one kind of fiber selected from the group consisting of glass fiber, meta-aromatic polyamide fiber, para-aromatic polyamide fiber, and polypara phenylene benzobisoxazole fiber.

4. The hot press cushioning material according to claim 1, wherein
said rubber includes at least one kind of rubber selected from the group consisting of fluororubber, EPM, EPDM, hydrogenated nitrile rubber, silicone rubber, acrylic rubber, and butyl rubber.

5. The hot press cushioning material according to claim 1, wherein
nonwoven fabric of said nonwoven fabric layer includes at least one kind of fiber selected from the group consisting of meta-aromatic polyamide fiber, para-aromatic polyamide fiber, and polypara phenylene benzobisoxazole fiber.

6. The hot press cushioning material according to claim 1, wherein
said resin includes at least one kind of resin selected from the group consisting of polyimide resin, fluororesin, phenol resin, melamine resin, epoxy resin, unsaturated polyester resin, silicone resin, thermosetting acrylic resin, furan resin, urea resin, diallyl phthalate resin, and polyurethane resin.

7. A method for manufacturing a hot press cushioning material comprising outer layers and an inner layer interposed between the outer layers, the method comprising the steps of:
manufacturing said outer layer; and
stacking said outer layers and said inner layer,
wherein the step of manufacturing said outer layer comprises the steps of:
preparing a woven fabric layer using bulky yarn as at least one of warp and weft;
placing a nonwoven fabric layer on only one surface side of said woven fabric layer and embedding a part of said nonwoven fabric layer into said woven fabric layer;
impregnating the stack of said woven fabric layer and said nonwoven fabric layer with resin from an opposite surface of said nonwoven fabric layer from said woven fabric layer to form a nonwoven fabric-resin composite layer; and
impregnating said stack with rubber from the other surface of said woven fabric layer to form a woven fabric-rubber composite layer; and
the step of stacking the outer layers and the inner layer comprises the step of:
positioning said woven fabric-rubber composite layer to face said inner layer.

* * * * *